(12) United States Patent
Hayashi

(10) Patent No.: US 7,324,022 B2
(45) Date of Patent: Jan. 29, 2008

(54) DATA ENCODING APPARATUS, DATA DECODING APPARATUS AND DATA ENCODING/DECODING SYSTEM

(75) Inventor: Takeo Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 184 days.

(21) Appl. No.: 11/342,382

(22) Filed: Jan. 27, 2006

(65) Prior Publication Data

US 2006/0184845 A1  Aug. 17, 2006

(30) Foreign Application Priority Data

Jan. 28, 2005  (JP) .............................. 2005-021199

(51) Int. Cl.
*H03M 5/00* (2006.01)

(52) U.S. Cl. .............................. 341/55; 341/87; 341/95; 341/106

(58) Field of Classification Search .................... 341/55
See application file for complete search history.

(56) References Cited

U.S. PATENT DOCUMENTS

| | | | |
|---|---|---|---|
| 5,387,911 A * | 2/1995 | Gleichert et al. | 341/95 |
| 6,603,412 B2 * | 8/2003 | Gatherer et al. | 341/61 |
| 7,061,408 B2 * | 6/2006 | Poechmueller | 341/55 |

FOREIGN PATENT DOCUMENTS

| | | |
|---|---|---|
| JP | 05-130423 | 5/1993 |
| JP | 05-183440 | 7/1993 |
| JP | 05-308622 | 11/1993 |
| JP | 06-131150 | 5/1994 |
| JP | 116534/1996 | 5/1996 |
| JP | 08-205142 | 8/1996 |
| JP | 09-006737 | 1/1997 |
| JP | 09-247466 | 9/1997 |
| JP | 09-331528 | 12/1997 |
| JP | 10-145237 | 5/1998 |
| JP | 10-271342 | 10/1998 |
| JP | 10-340543 | 12/1998 |
| JP | 2000-214237 | 8/2000 |
| JP | 2003-015863 | 1/2003 |

* cited by examiner

*Primary Examiner*—Khai M. Nguyen
(74) *Attorney, Agent, or Firm*—Scully, Scott, Murphy & Presser, P.C.

(57) ABSTRACT

A data encoding apparatus extracts valid data to be encoded from received data and encodes the data, and realigns the encoded data in units of a predetermined data width and outputs the data having each unit of the predetermined data width. A data decoding apparatus extracts valid data to be decoded from received data and realigns the decoded data in units of a predetermined data width and outputs the data having each unit of the predetermined data width.

9 Claims, 7 Drawing Sheets

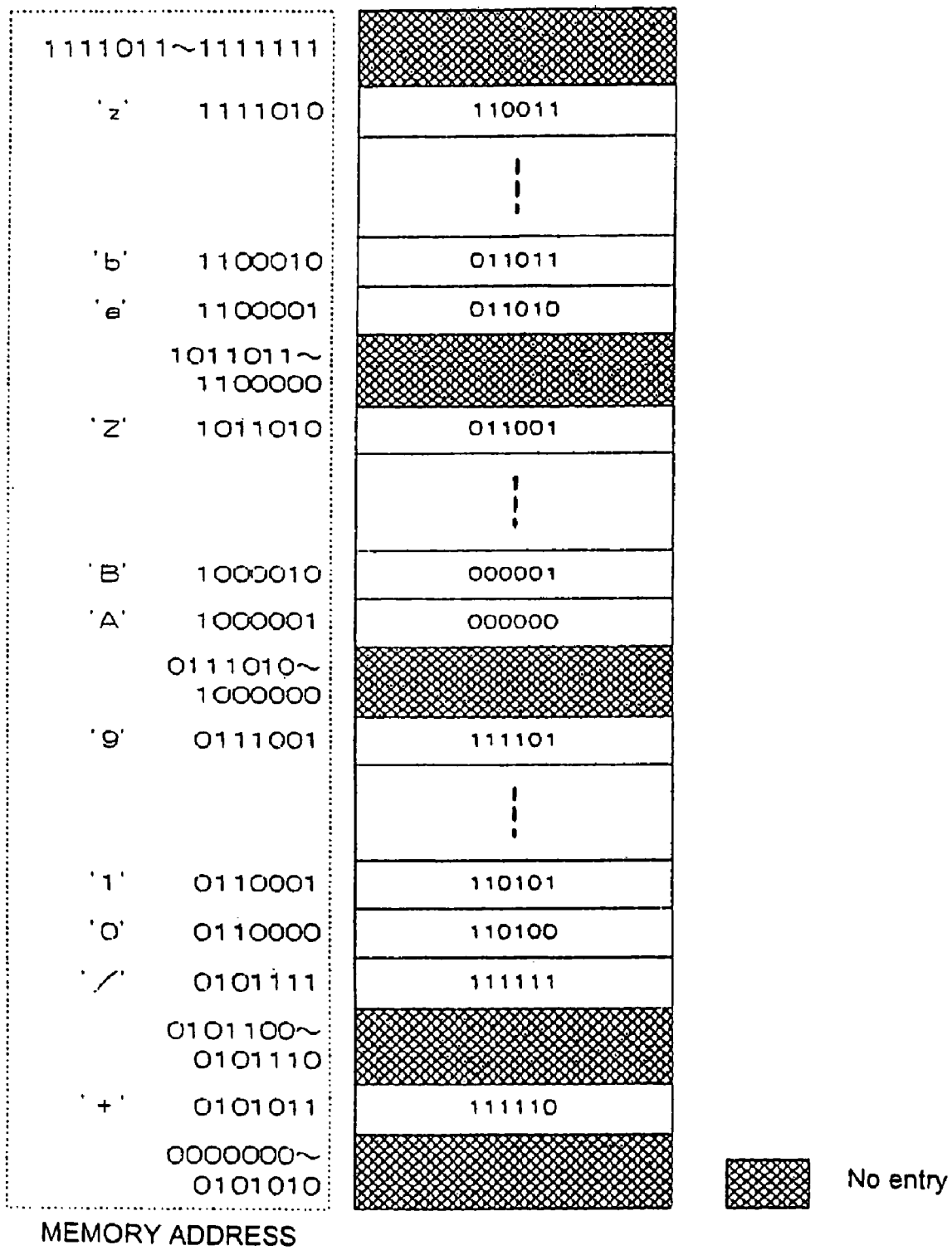
F I G. 6

DATA ENCODING APPARATUS, DATA DECODING APPARATUS AND DATA ENCODING/DECODING SYSTEM

BACKGROUND OF THE INVENTION

1. Field of the Invention

The present invention relates to a data encoding apparatus, data decoding apparatus and data encoding/decoding system for performing data encoding and decoding processes.

2. Description of the Related Art

It has been conventionally known that, when electronic mail attached with binary data such as images, word-processor documents and the like is transmitted, the binary data needs to be substituted with a character string. Examples of methods of substituting the binary data into character strings include Base 64, Quoted-Printable and the like, defined in RFC2045.

Generally, in companies and internet providers, a virus scan of received and transmitted e-mails is implemented at the mail servers or gate ways, and this virus scan is performed for the files (binary data) attached to e-mails. Since the images in a file, and/or documents, attached to e-mail as described above have been encoded using Base 64 or Quoted-Printable, it is necessary to implement a decoding process.

Conventionally, encoding and decoding processes using Base 64, Quoted-Printable or the like are implemented by software. However, use of software has the disadvantage of low processing speed. Further, because any process based on software has no means of improving the processing speed, though the processing speed of a process based on hardware can be improved by using a parallel process, use of software has faced difficulties in improving processing speed.

In recent years, there has been an increasing demand for high-speed encoding/decoding processes, as the number of virus infected emails increase.

Incidentally, it is disclosed in, for example Japanese Patent Application Laid-open 116534/1996 that image data is divided into a multiple number of image data streams so that these image data streams are encoded in parallel to thereby achieve high speed encoding of image data.

This publication of Japanese Patent Application Laid-open 116534/1996 discloses a technique for implementing parallel encoding/decoding using hardware. However, it is not simple to perform parallel encoding/decoding based on Base 64, Quoted-Printable etc., because invalid byte data such as control codes need to be inserted and removed so that the amount of data increases or decreases according to the encoding/decoding processes.

SUMMARY OF THE INVENTION

It is therefore an object of the present invention to provide a data encoding apparatus and data decoding apparatus and a data encoding/decoding system whereby encoding/decoding processes can be implemented at high speeds.

In order to achieve the above object, the present invention is configured as follows:

A data encoding apparatus includes: a data extractor for extracting data to be encoded from received data; a data encoder for encoding the data extracted by the data extractor; an encoded data realignment unit for realigning the data output from the data encoder in units of a predetermined data width; and, a data transmitter for outputting the data having every unit of a predetermined data width output the data output from the encoded data realignment unit.

Also, a data decoding apparatus includes: a data decoder for decoding received data; a decoded data realignment unit for realigning the data output from the data decoder in units of a predetermined data width; and, a data transmitter for outputting the data having each unit of a predetermined data width output from the decoded data realignment unit.

Further, a data encoding/decoding system, includes: a data encoder/decoder which, in accordance with an encoding/decoding mode signal supplied from without, encodes received data when encoding received data and decodes the received data when decoding received data; a data realignment unit for realigning the data output from the data encoder/decoder in units of a predetermined data width; and a data transmitter for outputting the data having each unit of a predetermined data width output from the data realignment unit.

According to the thus constructed data encoding apparatus, data decoding apparatus and data encoding/decoding system, the encoded data realignment unit or the decoded data realignment unit realigns the encoded data or decoded data in units of a predetermined data width. Therefore, if the amount of data increases or decreases as a result of the encoding or decoding process, the encoded data or decoded data from the data transmitter can be output by every unit of a predetermined data width. Accordingly, it is possible to encode/decode a multiple pieces of data input in parallel, hence it is possible to realize encoding and decoding at high speeds.

The above and other objects, features, and advantages of the present invention will become apparent from the following description with reference to the accompanying drawings which illustrate examples of the present invention.

BRIEF DESCRIPTION OF THE DRAWINGS

FIG. 6 is a schematic diagram showing an example of the configuration of a decoding table shown in FIG. 2.

DETAILED DESCRIPTION OF THE PREFERRED EMBODIMENT (The First Embodiment)

Figure 1:
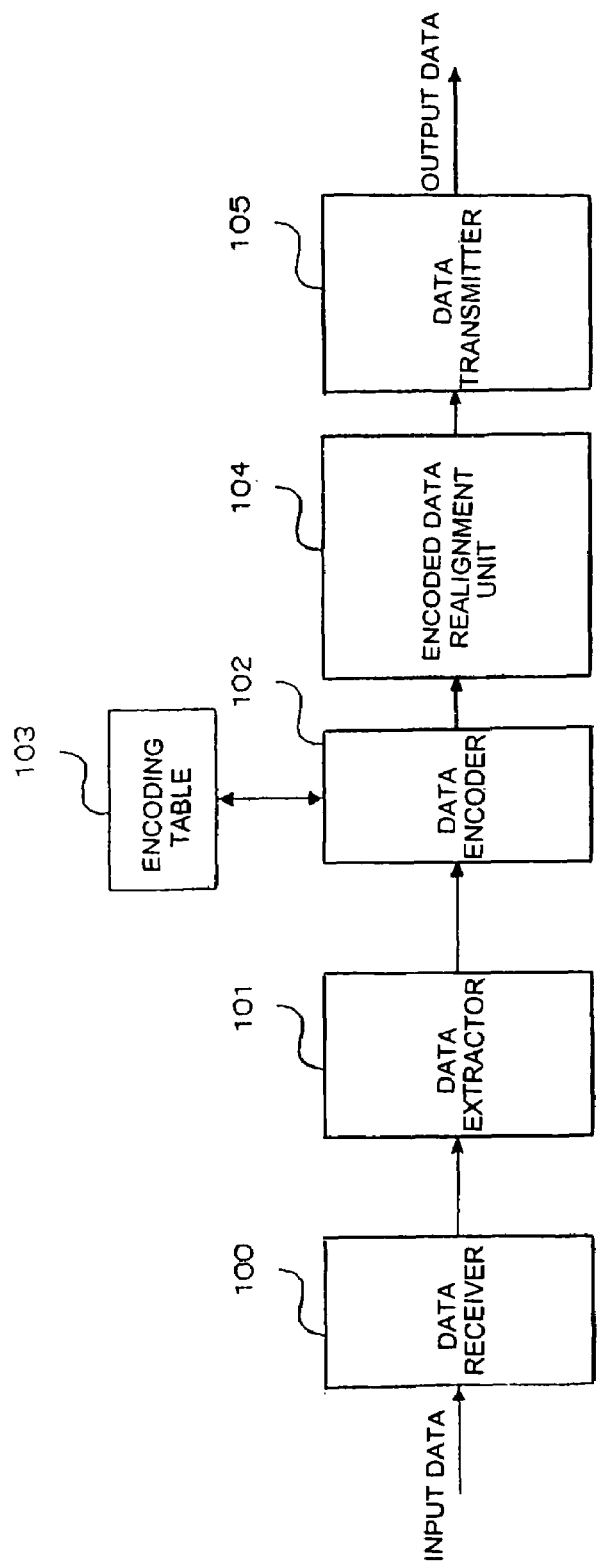
FIG. 1 is a block diagram showing the configuration of a data encoding apparatus included in a data encoding/decoding system according to the first embodiment of the present invention.

As shown in FIG. 1, a data encoding apparatus of the present embodiment includes: data receiver 100 for receiving data and converting the data into data of a data width that is easily processible by subsequent blocks; data extractor

101 for extracting valid data to be encoded, from the received data by data receiver 100; data encoder 102 for encoding the valid data extracted by data extractor 101, based on encoding table 103; encoded data realignment unit 104 for realigning the encoded data in units of a predetermined data width; and data transmitter 105 for transmitting the encoded data having each unit of a predetermined data width output from encoded data realignment unit 104 to the subsequent block.

Figure 2:
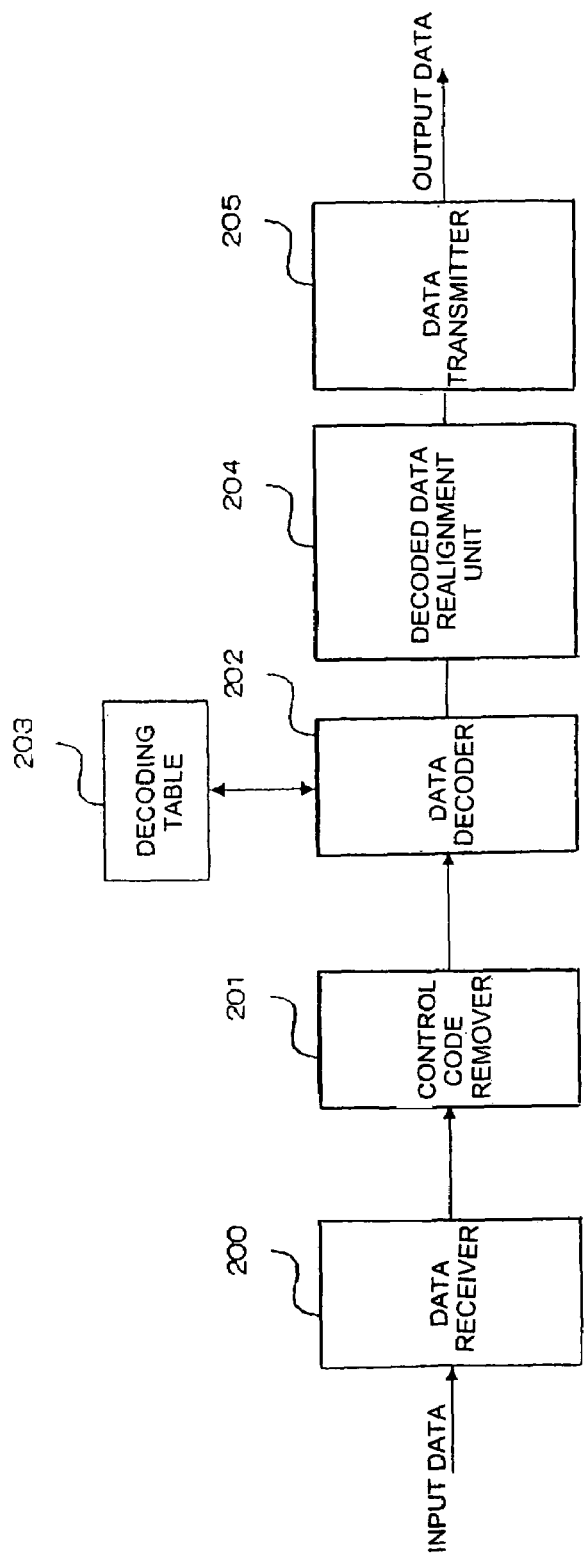
FIG. 2 is a block diagram showing the configuration of a data decoding apparatus included in a data encoding/decoding system of the first embodiment of the present invention.

As shown in FIG. 2, the data decoding apparatus of the present embodiment includes: data receiver 200 for receiving data; control code remover 201 for removing control codes from the received data by data receiver 200; data decoder 202 for extracting data to be decoded from the received data and decoding it based on decoding table 203; decoded data realignment unit 204 for realigning the decoded data in units of a predetermined data width; and data transmitter 205 for transmitting the decoded data having each unit of a predetermined data width output from decoded data realignment unit 204 to the subsequent stage.

As shown in FIGS. 1 and 2, in this embodiment, data encoding/decoding is implemented by hardware. When encoding/decoding is effected by hardware, the data is generally processed by one-byte (one character) units; however, in the present invention, multiple bytes of data are encoded/decoded in parallel to achieve high-speed processing.

Generally, when multiple pieces of byte data made up of images, word processor documents etc., attached to an e-mail transmitted via the Internet or the like are encoded/decoded in parallel, invalid byte data such as control codes need to be inserted or removed. In the present embodiment, as will be described later a switching portion is provided for encoded data realignment unit 104 and decoded data realignment unit 204, to implement inserting and removing processes of control codes, etc. by using the switching portion, thus making it possible to encode/decode multiple pieces of byte data in parallel.

Next, the operations of the data encoding apparatus and data decoding apparatus of the present embodiment will be described. In the data encoding apparatus and data decoding apparatus of the present embodiment, it is assumed that data of N (N≦8) bits is encoded into data of 8×M (M≧1) bits while data of 8×M is decoded into data of N bits. It is further assumed that the input to the data encoding apparatus and data decoding apparatus is data that is expanded in all parallel L(L>1) bytes (to be referred to hereinbelow as L-byte parallel data) while the output from the data encoding apparatus and data decoding apparatus is data that is expanded in all parallel J(J>1) bytes (to be referred to hereinbelow as J-byte parallel data).

To begin with, the operation of the data encoding apparatus of the present invention will be described with reference to FIG. 1.

L-byte parallel data is input to the data encoding apparatus. The input L-byte parallel data is received by data receiver 100. Data receiver 100 converts the input data into data of a data width that is easily processible in the subsequent blocks. Specifically, when encoding unit N is equal to 2, 4 or 8, no conversion is done and the data is output to the following block as it is, i.e., as L-byte parallel data. When encoding unit N is other than 2, 4 and 8, an integer K that is a multiple of N and is equal to or greater than L is determined, and the data is converted into data arranged in all parallel K-bytes (to be referred to hereinbelow as K-byte parallel data) and output to the subsequent block. When, for example N=3 and L=4, K is equal to 6. When N=5 and L=4, K is equal to 5.

Data extractor 101 extracts N-bit data to be encoded, from the data expanded in K-byte parallel form, and outputs it to the following stage, i.e., data encoder 102.

Data encoder 102 encodes the N-bit data extracted by data extractor 101 into 8×M bit data, by reference to encoding table 103. Encoding table 103 is included in a memory that stores 8×M bit data as the converted data in correspondence with addresses, defined by data of N bits which is the encoding unit. The data after encoding (encoded data) is judged by every byte unit as to whether it is valid or not, and then is output together with the result of judgement, i.e., the valid/invalid information is output to encoding data realignment unit 104.

Encoded data realignment unit 104 realigns only pieces of data that have been determined to be valid (valid data), in J-byte parallel form.

Data transmitter 105 outputs the data output from encoded data realignment unit 104, in all parallel J-bytes. During this process, data transmitter 105 waits for J bytes of data to arrive, and outputs them each time J bytes of data arrive.

Next, the operation of the data decoding apparatus of the present embodiment will be described with reference to FIG. 2.

L-byte parallel data is input to the data decoding apparatus. The input L-byte parallel data is received by data receiver 200. Data receiver 200 transfers the input data to the subsequent stage, i.e., control code remover 201. Control code remover 201 extracts control codes that are to be removed from the input data. The control codes to be removed include, for example, newline codes (0×0a0×0d: 0× denotes hex representation) and the like. Control code remover 201 outputs the input data with corresponding valid/invalid information to the following stage, e.g., data decoder 202, and excludes control codes from the data to be decoded by designating them as invalid information.

Upon receiving the input data with their valid/invalid information, data decoder 202 extracts valid data to be decoded and decodes the data based on decoding table 203. The data after decoding (decoded data) is output together with valid/invalid information to decoded data realignment unit 204.

Decoding data realignment unit 204 realigns the decoded data output from data decoder 202 in J-byte parallel form, in the same manner as encoded data realignment unit 104.

Data transmitter 205 outputs the data output from decoded data realignment unit 204, in all parallel J bytes. During this process, data transmitter 205 waits for J bytes of data to arrive, and outputs them each time J bytes of data arrive.

Figure 3:
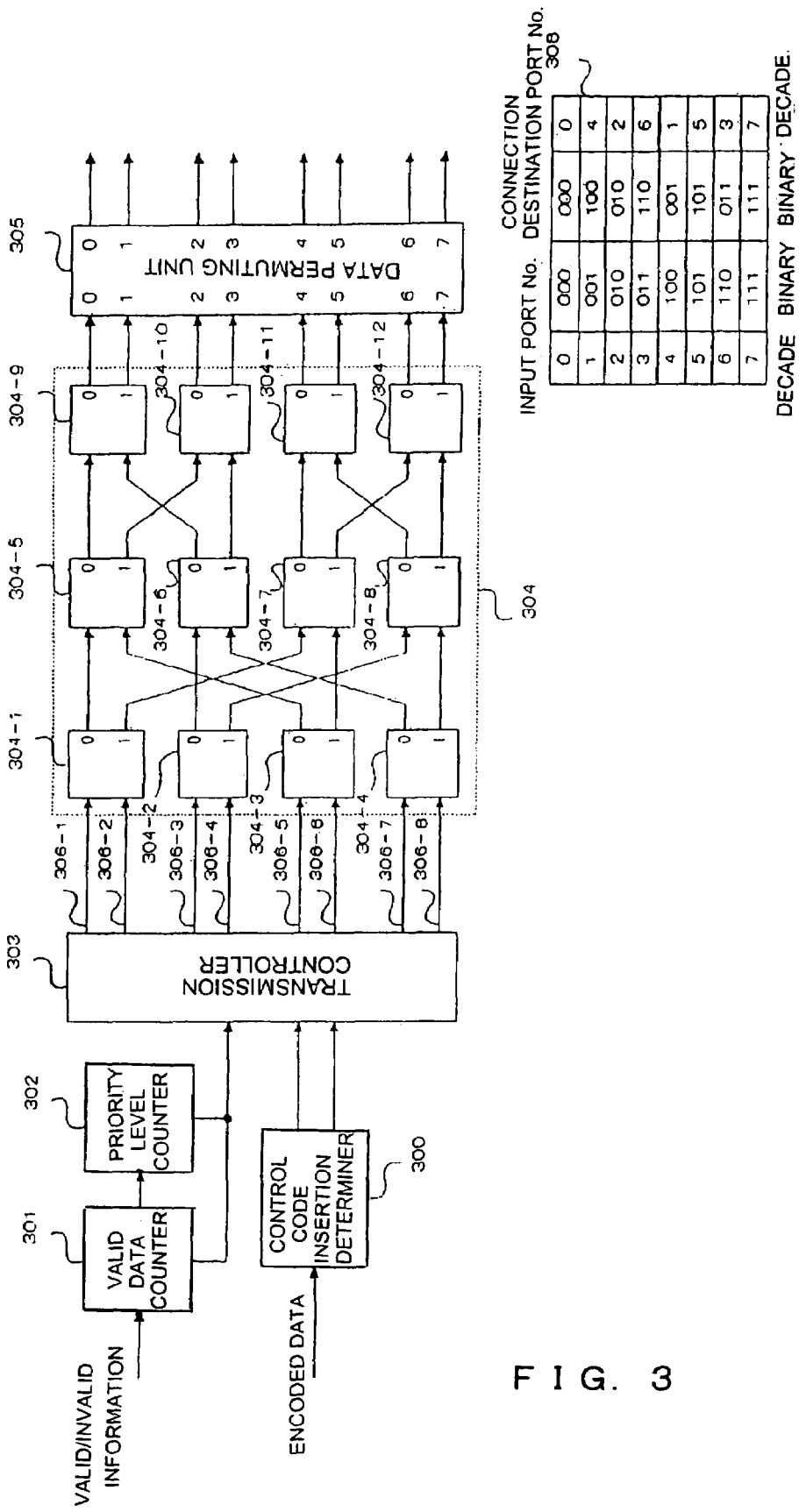
FIG. 3 is a block diagram showing an example of the configuration of an encoded data realignment unit shown in FIG. 1.
Figure 4:
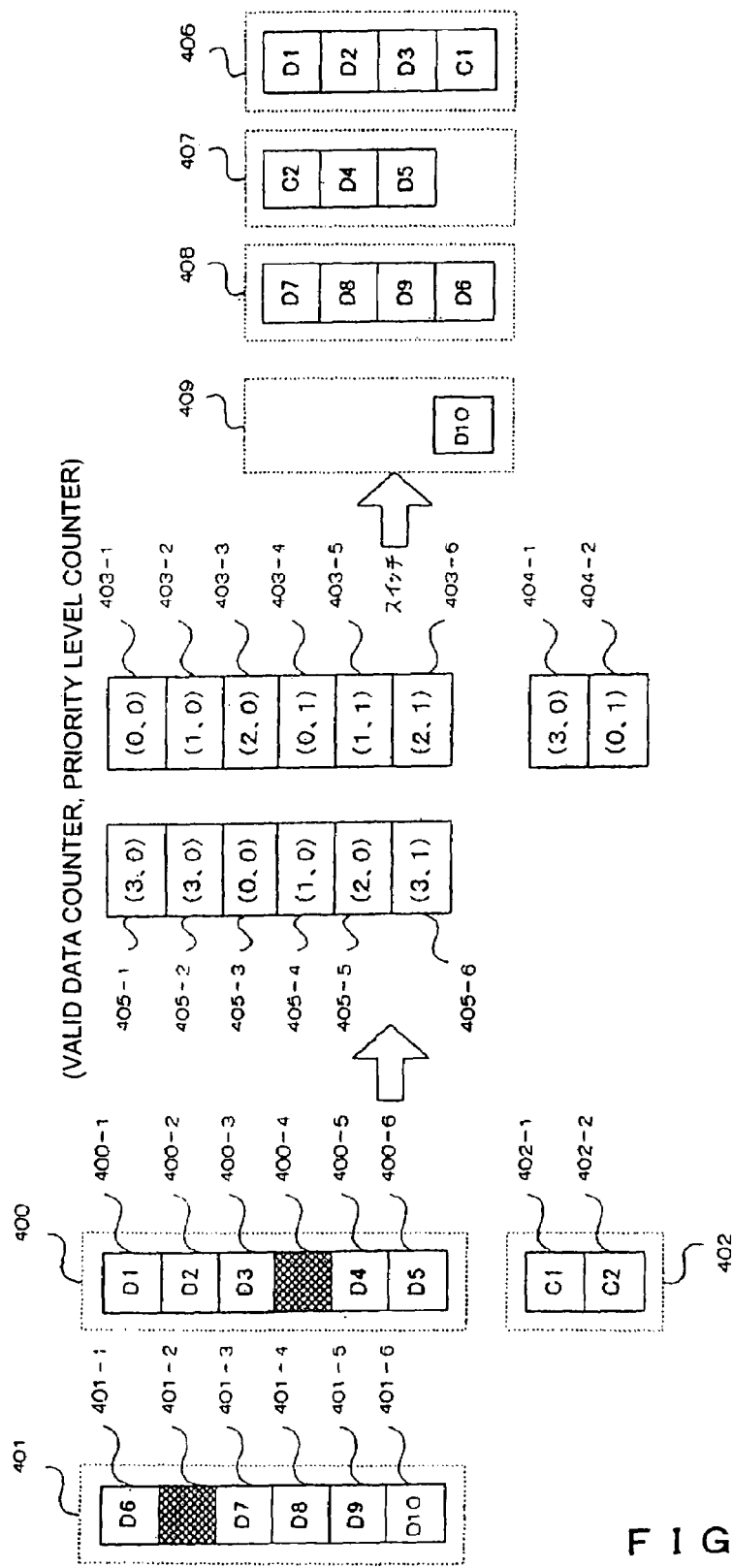
FIG. 4 is a schematic diagram showing how the input data is realigned by the process effected by the encoded data realignment unit shown in FIG. 3.

Referring next to FIGS. 3 and 4, encoded data realignment unit 104 shown in FIG. 1 will be described in detail.

As shown in FIG. 3, encoded data realignment unit 104 includes: valid data counter 301 for counting the number of valid data (encoded data) based on the valid/invalid information; priority level counter 302 for determining the degree of priority of each piece of data; control code insertion determiner 300 for determining whether a control code is inserted or not into encoded data; transmission controller 303 for controlling the order of transmission of pieces of data in accordance with the priority levels determined by priority level counter 302, and for generating, based on the count result on valid data counter 301, transfer information which will be used by a subsequent block, switching portion 304, and for outputting each piece of data together with the transfer information; switching portion 304 for arranging the data output from transmission controller 303; and data permuting unit 305 for permuting the data output from switching portion 304 in byte units and for outputting the data in units of a predetermined data width.

Switching portion 304 comprises an 8×8 switch made up of three connected stages of four 2×2 switches, for example. Each of 2×2 switches 304-1 to 304-12 determines its output destination based on the transfer information imparted to each piece of data. Though an 8×8 switch that is constructed of multiple 2×2 switches is shown as an example in FIG. 3, switching portion 304 is not limited to the 8×8 switch and switches of any size may be used.

Here, while FIG. 3 shows a configuration of encoded data realignment unit 104, decoded data realignment unit 204 shown in FIG. 2 may have a similar configuration except control code insertion determiner 300 shown in FIG. 3.

As encoded data realignment unit 104 receives encoded data and valid/invalid information from data encoder 102, control code insertion determiner 300 judges whether a control code is inserted or not. Encoded data realignment unit 104 inserts a control code when, for example, data of a predetermined number of bytes has been received.

Valid data counter 301 counts the number of valid data of the data received from data encoder 102 based on the valid/invalid information. Priority level counter 302 generates priority level information on the data to be sent to switching portion 304.

Transmission controller 303 generates transfer information to be used in switching portion 304 based on the control codes supplied from control code insertion determiner 300, encoded data, and the count result output from valid data counter 301. Transmission controller 303 adds the transfer information to each byte data including encoded data and control codes, and outputs the resultant data in the order of priority level information generated by priority level counter 302.

Switching portion 304 transfers data in accordance with the transfer information received from transmission controller 303. Data permuting unit 305 outputs the pieces of data that are output from switching portion 304 to respective, permuted specified, destinations based on the information stored in connection table 308 shown in FIG. 3. The connection table of FIG. 3 shows an example where the pieces of data input to input ports 0, 1, 2, 3, 4, 5, 6 and 7 are output to designated connection ports 0, 4, 2, 6, 1, 5, 3 and 7, respectively.

Now, the operation of encoded data realignment unit 102 shown in FIG. 3 will be described in a more specific manner.

Here, it is assumed that the data input to encoded data realignment unit 104 is 6-byte parallel data and that the output data is 4-byte parallel data. It is also assumed that encoded data realignment unit 104 adds 2-bytes of control codes. Switching portion 304 employs an 8×8 switch as shown in FIG. 3.

It is also assumed that first input data 400 and second input data 401 are input to encoded data realignment unit 104, as shown in FIG. 4. First input data 400 is composed of byte data 400-1 to 400-6 and second input data 401 is composed of byte data 401-1 to 401-6. It is assumed that bytes 400-4 and 401-2, indicated by shading in FIG. 4 are invalid data while the data other than these are valid data. For example, in first input data 400, two bytes of control codes 402-1 and 402-2 are inserted after third byte data (D3) 400-3.

In the present embodiment, as valid data counter 301, a counter capable of counting 0 to 3 is used. On the other hand, priority level counter 302 uses a counter that is able to count 0 to 1 and returns to "0" when the count reaches the maximum value. The initial value of valid data counter 301 is set at "3" and the initial value of priority level counter 302 is set at "0".

In general, when data in X-parallel form is realigned into data in Y-parallel form, a counter capable of counting 0 to X−1 is used as valid data counter 301 with its initial value set at "X−1". As-priority level counter 302, a counter capable of counting 0 to the greatest integer smaller than X/Y is used with its initial value set at "0".

In this configuration, as first input data 400 is input to encoded data realignment unit 104, valid data counter 301 performs the following operations on byte data 400-1 to 6 and control codes 402-1 to 2 of the input data, and outputs the result of the operations.

First, as byte data 400-1 is input, valid data counter 301 increases the count value by "1" from the initial value "3" and outputs "0" because byte data 400-1 is valid data.

Subsequently, as byte data 400-2 is input, valid data counter 301 increases the count value by "2" from the initial value "3" and outputs "1" because two pieces of valid data, byte data 400-1 and 400-2 have been presented.

Next, as byte data 400-3 is input, valid data counter 301 increases the count value by "3" from the initial value "3" and outputs "2" because three pieces of valid data, byte data 400-1, 400-2 and 400-3 have been presented.

In this case, since control code 402-1 is inserted, valid data counter 301 performs the same operation and outputs "3" in correspondence to control code 402-1. Priority level counter 302 has output "0" up to this point and will increment the count value for the next valid data. That is, priority level counter 302 increases the count if more than one valid data having the same valid data count value exist in first input data 400 or 401.

The same operation is performed for control code 402-2, and valid data counter 301 outputs "0". Because valid data counter 301 has already output "0" for byte data 400-1, priority counter 302 increments the count to "1".

As byte data 400-4 is input, valid data counter 301 does not increment the count value because byte data 400-4 is invalid data.

The same operations are performed for byte data 400-5 and 400-6; valid data counter 301 outputs "1" as byte data 400-5 is input, and valid data counter 301 outputs "2" as byte data 400-6 is input.

To sum up the above operations, for first input data 400, valid byte counter 301 and priority level counter 302 output respective values indicated by 403-1 to 403-6 and 404-1 to 404-2 in FIG. 4.

These pieces of byte data having the byte count value and priority level count value, indicated by 403-1 to 403-6 and 404-1 to 404-2 in FIG. 4 are output together with the valid byte count value, from transmission controller 303 when the value on priority level counter 302 is small ("0") and when the data is valid.

The valid byte count value is used as switch setup information in the next stage, i.e., switching portion 304. Specifically, when the valid byte count value (3 bit information) is written in binary, the value is represented by three bits, namely bit 1, bit 2 and bit 3 from the lowest bit. Bit 1 is used as the setup information for 2×2 switches 304-1 to 304-4 in the first stage of switching portion 304, bit 2 is used as the setup information for 2×2 switches 304-5 to 304-8 in the second stage and bit 3 is used as the setup information for 2×2 switches 304-9 to 304-12 in the third stage.

Each of 2×2 switches 304-1 to 304-12 in switching portion 304 selects the output port "0" when the corresponding bit of the valid byte count value of the input data is "0", and selects the output port "1" when the corresponding bit is "1".

First byte data 400-1 of first input data 400 is input as byte data 306-1 to switching portion 304. Since the valid byte count value is "000b" (data tagged with b at its end is data represented in binary notation), the data is transferred to input port "0" of data permuting unit 305 by way of 2×2 switches 304-1, 304-5 and 304-9, and is output from output port "0" in accordance with connection table 308 shown in FIG. 3.

Similarly, second byte data 400-2 is input as byte data 306-2 to switching portion 304. Since the valid byte count value is "001b", the data is transferred to input port "4" of data permuting unit 305 by way of 2×2 switches 304-1, 304-7 and 304-11, and is output from output port "1" in accordance with connection table 308 shown in FIG. 3.

For third byte data 400-3 and control code 402-1 that have a priority level count value of "0", the same process is implemented, and output data 406 is produced. For byte data having a priority level count value of "1", output data 407 is produced (description is omitted since this process is implemented in the same manner as above).

When second input data 401 is input to encoded data realignment unit 104, the initial value on valid data counter 301 is "2", which is the value after first input data 400 has been processed. This is the point that is different from the process for first input data 400. However, the same process as has been done for first input data 400 is implemented after that, and output data 408 and 409 are obtained.

The data output from encoded data realignment unit 104 is sent out in 4-byte units by data transmitter 105. At this point, data transmitter 105 does not start transmission at the moment when output data 407 is received because there is no fourth byte data, for example in output data 407 of coded data realignment unit 104, but starts transmitting output data 407 together with the fourth byte data (D6) of output data 408 only when the next output data 408 has arrived.

Similarly, the first to third bytes (D7 to D9) are output together with the byte data (D10) of output data 409 after it arrives. However, when the last byte data to be encoded has been received, the data is sent out without waiting for arrival of the next data.

The detailed operation of encoded data realignment unit 104 has been described heretofore. Similarly, decoded data realignment unit 204 can also be configured in the same manner except that no process for inserting the control codes is performed. Further, in the above described example, the transfer process by switching portion 304 of encoded data realignment unit 104 is performed in byte units, however, the process by switching portion 304 should not be particularly limited to byte data.

Figure 5:
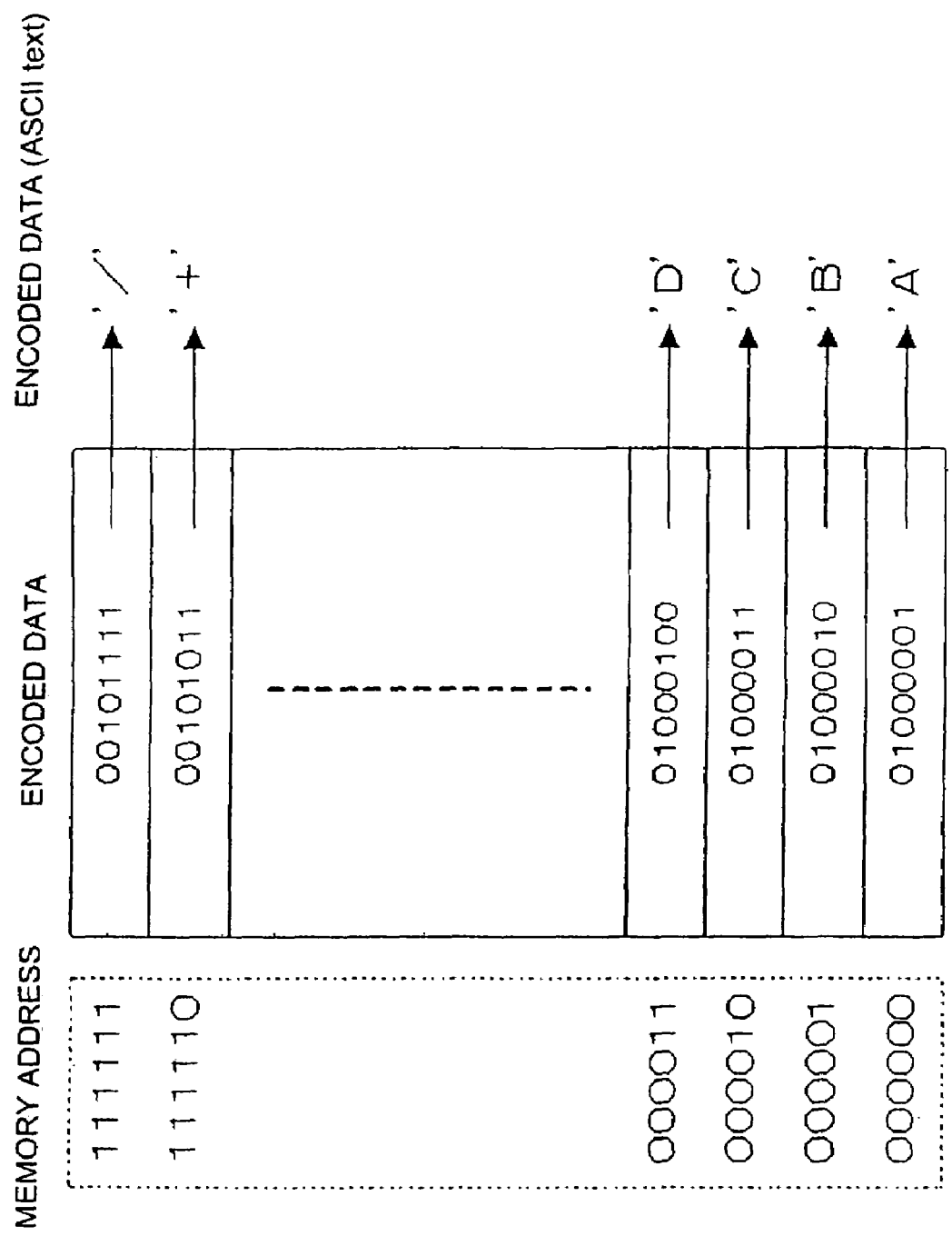
FIG. 5 is a schematic diagram showing an example of the configuration of an encoding table shown in FIG. 1.

Referring next to FIGS. 5 and 6, the conversion tables used for encoding and decoding processes of the present embodiment will be described. Here, the following description will be given taking an example where Base 64 is used for encoding and decoding.

Base 64 is an encoding scheme for converting 6-bit data into ASCII text which can be represented by 8 bits. As shown in FIG. 5, encoding table 103 is realized by a memory in which each memory location has an address of 6-bit data to be encoded and stores corresponding encoded 8-bit data (ASCII text) therein.

On the other hand, decoding table 203 is realized as shown in FIG. 6 by a memory in which each memory location has an address of 8-bit data to be decoded (ASCII text) and stores corresponding decoded 6-bit data therein.

Though the present embodiment has been described by taking an example in which the Base 64 conversion table is used a memory, it is not necessary to use a memory for cases which handle simple conversions such as a conversion that can be done simply by bit operations.

According to data encoding/decoding system of the present embodiment, since encoded data realignment unit 104 or decoded data realignment unit 204 realigns the encoded data or decoded data in units of a predetermined data width, if the amount of data increases or decreases as a result of encoding or decoding, the encoded data or decoded data from data transmitter 105 or 205 can be output by every unit of a predetermined data width, thus making it possible to encode/decode multiple pieces of data that are input in parallel. As a result, it is possible to realize encoding and decoding at high speeds.

(The Second Embodiment)

Next, the second embodiment of the data encoding/decoding system of the present invention will be described with reference to FIG. 7.

Figure 7:
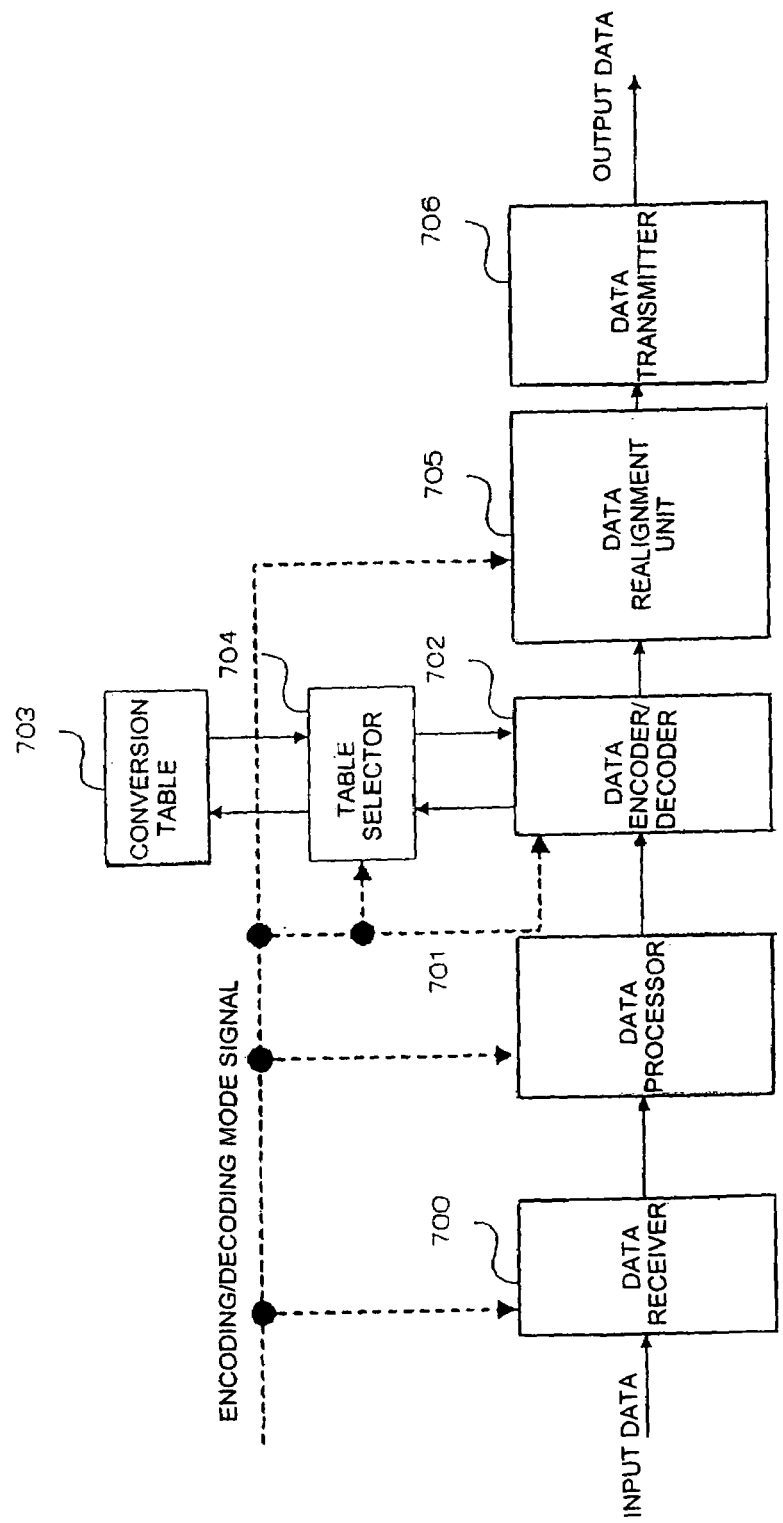
FIG. 7 is a block diagram showing the configuration of a data encoding/decoding system according to the second embodiment of the present invention.

As shown in FIG. 7, the data encoding/decoding system of the second embodiment includes data receiver 700, data processor 701, data encoder/decoder 702, data realignment unit 705, data transmitter 706, conversion table 703 and table selector 704.

The data encoding/decoding system of the present embodiment is one that realizes both the data encoding apparatus and the data decoding apparatus described in the first embodiment, by a common configuration. Data receiver 700 is a configuration that provides both the function of data receiver 100 of the data encoding apparatus and the function of data receiver 200 of the data decoding apparatus, described in the first embodiment. Data processor 701 is a configuration that provides both the function of data extractor 101 of the data encoding apparatus and the function of control code remover 201 of the data decoding apparatus, described in the first embodiment. Data encoder/decoder 702 is a configuration that provides both the function of data encoder 102 of the data encoding apparatus and the function of data decoder 202 of the data decoding apparatus, described in the first embodiment. Data realignment unit 705 is a configuration that provides both the function of encoded data realignment unit 104 of the data encoding apparatus and the function of decoded data realignment unit 204 of the data decoding apparatus, described in the first embodiment. Further, data transmitter 706 is a configuration that provides both the function of data transmitter 105 of the data encoding apparatus and the function of data transmitter 205 of the data decoding apparatus, described in the first embodiment. Conversion table 703 is a configuration that provides both the function of data encoding table 103 of the data encoding apparatus and the function of decoding table 203 of the data decoding apparatus, described in the first embodiment.

This embodiment is implemented by using switches for data realignment. That is, data realignment unit 705 that can be commonly used for encoding and decoding is configured by using switches which have a larger size than those used for encoding and decoding.

Data receiver 700, data processor 701, data encoder/decoder 702 and data realignment unit 705 implement encoding or decoding in accordance with the encoding/decoding mode signal supplied from an external device.

Table selector 704 switches the mode of conversion table 703 (between the encoding table and the decoding table) according to the encoding/decoding mode signal so as to provide the table corresponding to the encoding or decoding process to be implemented in data encoder/decoder 702.

Since the functions, of the data encoding apparatus and the functions as the data decoding apparatus, provided by data receiver 700, data processor 701, data encoder/decoder 702, conversion table 703, data realignment unit 705 and data transmitter 706, are the same as those in the first embodiment, the detailed description is omitted.

According to the data encoding/decoding system of the present embodiment, since the data encoding apparatus and data decoding apparatus presented by the first embodiment are realized by a common configuration, it is possible to provide the same effect as that of the data encoding apparatus and data decoding apparatus of the first embodiment and still achieve the encoding and decoding processes with a smaller circuit. As a result, it is possible to reduce the area for mounting circuits and hence reduce the cost of the data encoding/decoding system.

While a preferred embodiment of the present invention has been described using specific terms, such description is for illustrative purposes only, and it is to be understood that changes and variations may be made without departing from the spirit or scope of the following claims.

What is claimed is:

1. A data encoding apparatus comprising:
   a data extractor for extracting data to be encoded from received data;
   a data encoder for encoding the data extracted by said data extractor;
   an encoded data realignment unit for realigning the data output from said data encoder in units of a predetermined data width; and,
   a data transmitter for outputting the data having each unit of a predetermined data width output from said encoded data realignment unit.

2. The data encoding apparatus according to claim 1, wherein said encoded data realignment unit includes a switching portion for permuting data, and a transmission controller for generating transfer information required for permuting the data by said switching portion.

3. The data encoding apparatus according to claim 1, wherein said encoded data realignment unit includes a control code insertion determiner for inserting predetermined control codes for all data having a predetermined number of bytes.

4. The data encoding apparatus according to claim 2, wherein said encoded data realignment unit includes a control code insertion determiner for inserting predetermined control codes for all data having a predetermined number of bytes.

5. A data decoding apparatus comprising:
   a data decoder for decoding received data;
   a decoded data realignment unit for realigning the data output from said data decoder in units of a predetermined data width; and,
   a data transmitter for outputting the data having each unit of a predetermined data width output from said decoded data realignment unit.

6. The data decoding apparatus according to claim 5, wherein said decoded data realignment unit includes a switching portion for permuting data, and a transmission controller for generating transfer information required for permuting the data by said switching portion.

7. The data decoding apparatus according to claim 5, further comprising:
   a control code remover for removing control codes from received data.

8. A data encoding/decoding system, comprising:
   a data encoder/decoder which, in accordance with an encoding/decoding mode signal supplied from an external device, encodes received data when encoding received data and decodes the received data when decoding received data;
   a data realignment unit for realigning the data output from said data encoder/decoder in units of a predetermined data width; and
   a data transmitter for outputting the data having each unit of a predetermined data width output from said data realignment unit.

9. The data encoding/decoding system according to claim 8, wherein said data realignment unit includes a switching portion for permuting data, and a transmission controller for generating transfer information required for permuting the data by said switching portion.

* * * * *